United States Patent
Eom et al.

(10) Patent No.: US 8,174,269 B2
(45) Date of Patent: May 8, 2012

(54) ABNORMAL SWITCHING MONITORING DEVICE AND ABNORMAL SWITCHING MONITORING METHOD

(75) Inventors: Hyun-Chul Eom, Seoul (KR); Jin-Tae Kim, Seoul (KR); Gwan-Bon Koo, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 428 days.

(21) Appl. No.: 12/623,127

(22) Filed: Nov. 20, 2009

(65) Prior Publication Data

US 2010/0134091 A1    Jun. 3, 2010

(30) Foreign Application Priority Data

Nov. 28, 2008   (KR) .................. 10-2008-0119852

(51) Int. Cl.
*G01R 31/02* (2006.01)
*H05B 37/02* (2006.01)
(52) U.S. Cl. ...................... 324/418; 315/224
(58) Field of Classification Search .................. 324/418
See application file for complete search history.

(56) References Cited

U.S. PATENT DOCUMENTS

| | | | |
|---|---|---|---|
| 5,883,473 A * | 3/1999 | Li et al. ...................... | 315/225 |
| 5,973,943 A | 10/1999 | Ribarich et al. | |
| 6,331,755 B1 * | 12/2001 | Ribarich et al. ............. | 315/225 |
| 7,378,807 B2 * | 5/2008 | Feldtkeller et al. ........... | 315/308 |
| 7,560,873 B2 * | 7/2009 | Feldtkeller et al. ........... | 315/224 |
| 7,982,452 B2 * | 7/2011 | Feldtkeller .................... | 324/120 |
| 8,022,637 B2 * | 9/2011 | Feldtkeller et al. ........... | 315/224 |
| 8,125,202 B2 * | 2/2012 | Feldtkeller et al. ........... | 323/271 |
| 2006/0034123 A1 | 2/2006 | Feldtkeller et al. | |

* cited by examiner

*Primary Examiner* — Jeff Natalini
(74) *Attorney, Agent, or Firm* — Okamoto & Benedicto LLP

(57) ABSTRACT

The present invention relates to an abnormal switching monitoring device and method. A time point when a high-side switch in which a first electrode receives an input voltage is turned on, a time point when a low-side switch that is connected to a second electrode of the high-side switch is turned on, a time point when a charge current begins to flow to a bootstrap circuit, and a time point when a charge current stops flowing to the bootstrap circuit are compared so as to determine whether or not non-zero voltage switching occurs. The bootstrap circuit supplies an operating current to a gate driver controlling a switching operation of the high-side switch.

18 Claims, 5 Drawing Sheets

US 8,174,269 B2

ABNORMAL SWITCHING MONITORING DEVICE AND ABNORMAL SWITCHING MONITORING METHOD

CROSS-REFERENCE TO RELATED APPLICATION

This application claims priority to and the benefit of Korean Patent Application No. 10-2008-0119852 filed in the Korean Intellectual Property Office on Nov. 28, 2008, the entire contents of which are incorporated herein by reference.

BACKGROUND OF THE INVENTION (a) Field of the Invention

The present invention relates to a monitoring device and method to detect an abnormal switching operation. Particularly, the present invention relates to a monitoring device to monitor non-zero voltage switching and a non-zero voltage switching method.

(b) Description of the Related Art

It is preferable that a MOSFET switch controlling an operation of a converter is controlled in order to operate with zero voltage switching. The switching loss is reduced and damage to the switch can be prevented under the condition of the zero voltage switching. The zero voltage switching means that a voltage at both ends of the switch is "0" at the turn-on time of the switch, For example, in case of a LLC resonant converter, when an overload is applied or an input voltage is low, a phase of a drain current of the MOSFET switch precedes a phase of a gate input signal. Then, a hard switching and a shoot-through phenomenon are generated in switching operations of the switch.

The hard switching is a phenomenon in which it is turned on before the voltage at both ends of the switch falls down "0". The shoot-through is the phenomenon in which a high peak current flows through the switch by a reverse recovery of a body diode. Such phenomenon increases the switching loss. In addition, it causes the switch to be damaged.

Accordingly, in case the switching when failing in the zero-voltage switching, that is, when the non-zero voltage switching occurs, a power consumption increase by switching loss and switch damage is caused.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an abnormal switching monitoring device and an abnormal switching monitoring method having advantages of monitoring non-zero voltage switching.

An exemplary embodiment of the present invention provides an abnormal switching monitoring device monitoring abnormal non-zero voltage switching of a low-side switch connected to a second electrode of a high-side switch including a first electrode receiving an input voltage. The abnormal switching monitoring device includes a bootstrap circuit supplying an operating current to a gate driver controlling a switching operation of the high-side switch, and compares a time point when a current begins to flow through the bootstrap circuit with a time point when the low-side switch is turned on so as to determine whether or not non-zero voltage switching of the low side switch occurs.

The bootstrap circuit includes a bootstrap capacitor connected to the gate driver and supplying the operating current thereto, a diode that makes the current flow to the bootstrap capacitor, and a current monitoring element including a first end to which the power source voltage is applied and a second end connected to the diode. The current monitoring element is a resistor. A first end of the bootstrap capacitor is connected to a cathode of the diode, a second end of the bootstrap capacitor is connected to a second electrode of the high-side switch, and an anode of the diode is connected to the second end of the current monitoring element.

The abnormal switching monitoring device compares voltages of both ends of the current monitoring element with each other, and uses the comparison result and a low-side gate signal controlling the low-side switch so as to determine whether or not the non-zero voltage switching occurs. The abnormal switching monitoring device further includes a comparator including an inversion terminal connected to the first end of the current monitoring element and an non-inversion terminal connected to the second end of the current monitoring element, and an AND gate receiving an output signal of the comparator and a low-side gate signal. The abnormal switching monitoring device determines non-zero voltage switching in case a time point when the charge current begins to flow is later than a time point when the low-side switch is turned on.

Another exemplary embodiment of the present invention provides an abnormal switching monitoring device monitoring abnormal non-zero voltage switching of the high-side switch including a first electrode receiving an input voltage. The abnormal switching monitoring device includes a bootstrap circuit supplying an operating current to a gate driver controlling a switching operation of the high-side switch, and compares a time point when the current does not flow through the bootstrap circuit with a time point when the high-side switch is turned on so as to determine whether or not non-zero voltage switching of the high-side switch occurs.

The bootstrap circuit includes a bootstrap capacitor connected to the gate driver and supplying an operating current, a diode that makes the current flow to the bootstrap capacitor, and a current monitoring element including a first end to which the power source voltage is applied and a second end connected to the diode. The current monitoring element is a resistor. A first end of the bootstrap capacitor is connected to a cathode of the diode, a second end of the bootstrap capacitor is connected to a second electrode of the high-side switch, and an anode of the diode is connected to the second end of the current monitoring element.

The abnormal switching monitoring device compares voltages of both ends of the current monitoring element with each other, and uses the comparison result and a high-side gate signal controlling the high-side switch so as to determine whether or not the non-zero voltage switching occurs. The abnormal switching monitoring device further includes a comparator including a non-inversion terminal connected to the first end of the current monitoring element and an inversion terminal connected to the second end of the current monitoring element, and an AND gate receiving an output signal of the comparator and a high-side gate signal. The abnormal switching monitoring device determines non-zero voltage switching in case a time point when the charge current stops flowing is later than a time point when the high-side switch is turned on.

Yet another exemplary embodiment of the present invention provides an abnormal switching monitoring method monitoring non-zero voltage switching of a low-side switch connected to the second electrode of the high-side switch including a first electrode received an input voltage. The abnormal switching monitoring method includes monitoring a charge current charging a bootstrap capacitor that supplies an operating current to a gate driver controlling a switching operation of the high-side switch, comparing a time point when the low-side switch is turned on with a time point when the charge current begins to flow, and determining whether non-zero voltage switching of the low-side switch occurs or not according to the comparison result. The abnormal switching monitoring method determines the non-zero voltage switching when a time point when the charge current begins to flow is later than a time point when the low-side switch is turned on.

Another exemplary embodiment of the present invention provides an abnormal switch monitoring method monitoring non-zero voltage switching of the high-side switch including a first electrode received an input voltage. The abnormal switching monitoring method includes monitoring a flow of a charge current charging a bootstrap capacitor that supplies an operating current to a gate driver controlling switching operation of the high-side switch, comparing a time point when the high-side switch is turned on with a time point when the charge current stops flowing; and determining whether or not non-zero voltage switching of the high-side switch occurs according to the comparison result. The abnormal switching monitoring method determines the non-zero voltage switching when a time point when the charge current stops flowing is later than a time point when the high-side switch is turned on.

As described above, the exemplary embodiments to the present invention provide an abnormal switching monitoring device and a non-zero voltage switching method for monitoring a zero voltage switching operation or a non-zero voltage switching operation.

DETAILED DESCRIPTION OF THE EMBODIMENTS

Figure 1:
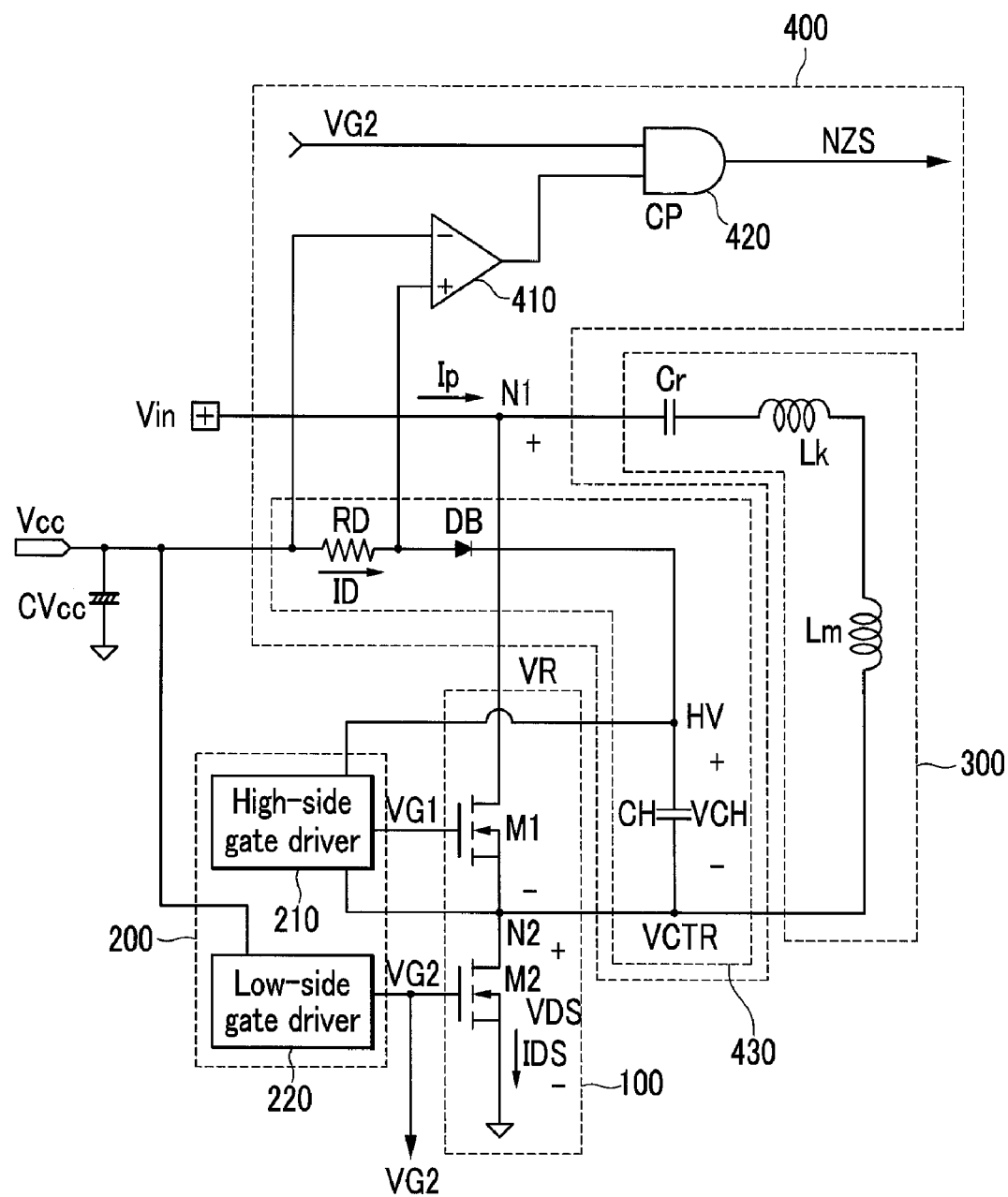
FIG. 1 shows a configuration of a converter to which an abnormal switching monitoring device is applied, according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, an abnormal switching monitoring device according to an exemplary embodiment of the present invention will be described in detail, referring to drawings showing a converter including the abnormal switching monitoring device.

FIG. 1 shows a configuration of a converter to which an abnormal switching monitoring device is applied, according to an embodiment of the present invention.

In FIG. 1, only the configurations needed for the description of the abnormal switching monitoring device are shown. As shown in FIG. 1, a converter includes a switch unit 100, a switch driver 200, a resonant network unit 300, and an abnormal switching monitoring device 400.

A bootstrap capacitor CH supplies an operating current so that a high-side gate driver 210 operates. A power source voltage Vcc is smoothed with a capacitor CVcc. A resistor RD is a damping resistor and stabilizes a charge current flowing to the bootstrap capacitor CH from a power source voltage Vcc. The abnormal switching monitoring device 400 includes a resistor RD, a bootstrap circuit 430 configured with the bootstrap capacitor CH, and a diode DB.

The switch unit 100 includes a high-side switch M1 and a low-side switch M2. The switch unit 100 generates an input DC voltage Vin with a switching operation of the high-side switch M1 and the low-side switch M2 to a square wave. Concretely, the high-side switch M1 and the low-side switch M2 are respectively turned on/off. Then, a peak value of a resonance input voltage VR between a node N1 and a node N2 is a voltage Vin, and a lowest value of the resonance input voltage VR is 0V. Therefore, the resonance input voltage VR becomes a square wave swinging from 0V to the voltage Vin.

The high-side switch M1 is controlled by a gate control signal VG1 transmitted from the high-side gate driver 210 of the switch driver 200, and the low-side switch M2 is controlled by a gate control signal VG2 transmitted from a low-side gate driver 220 of the switch driver 200. According to an exemplary embodiment of the present invention, the high-side switch M1 and the low-side switch M2 are metal oxide semiconductor field-effect transistors (MOSFET), and are n-channel MOSFETs (NMOSFET).

The resonant network unit 300 includes a resonance capacitor Cr, a leakage inductor Lk, and a magnetizing inductor Lm. A resonance occurring among the resonance capacitor Cr, the leakage inductor Lk, and the magnetizing inductor Lm is controlled according to switching operation of the high-side switch M1 and the low-side switch M2.

When the high-side switch M1 is turned off and the low-side switch M2 is turned on, an input current Ip increases according to a sine wave form. The input current Ip increases to a current larger than 0, and a direction where the input current Ip flows is changed. And then, a voltage charged with the resonance capacitor Cr increases.

On the contrary, when the high-side switch M1 is turned on and the low-side switch M2 is turned off, the input current Ip decreases according to a sine wave form. The input current Ip decreases to a current smaller than 0, and the direction where the input current Ip flows is changed.

And then, the voltage of the resonance capacitor Cr decreases. The switch driver 200 includes the high-side gate driver 210 and the low-side gate driver 220. The high-side gate driver 210 generates the gate signal VG1 for controlling the switching operation of the high-side switch M1, and the low-side gate driver 220 generates the gate signal VG2 for the switching operation of the low-side switch M2.

According to an exemplary embodiment of the present invention, the high-side switch M1 and the low-side switch M2 are alternately turned on/off by a predetermined duty cycle. There is a predetermined dead time period between a turn-on time of the high-side switch M1 and a turn-on time of the low-side switch M2. The high-side switch M1 and the low-side switch M2 are turned off during the dead time.

Accordingly, the gate signal VG1 and the gate signal VG2 are alternately high level signals. The two signals have low levels during the dead time. The high-side gate driver 210 is connected to both ends of the bootstrap capacitor CH, and is provided with a necessary power source from the bootstrap capacitor CH in operation. The high-side gate driver 210 receives a voltage HV of a first end of the bootstrap capacitor CH and a voltage VCTR of a second end of the bootstrap capacitor CH, and generates the gate signal VG1.

The switch driver 200 and the low-side gate driver 220 are provided with a power source from the power source voltage Vcc. By using a voltage between both ends of the resistor RD and the gate signal VG2, the abnormal switching monitoring device 400 determines whether zero voltage switching of the low-side switch M2 is normally performed.

The abnormal switching monitoring device 400 determines that the switching of the low-side switch M2 has failed with respect to the zero voltage switching when a time point when the charge current ID begins to flow to the bootstrap capacitor CH is later than a time point when the low-side switch M2 is turned on.

In order to make the charge current ID begin to flow to the bootstrap capacitor CH, the diode DB has to be conductive. The voltage HV is lower than the power source voltage Vcc so that the diode DB conducts. Since the voltage HV is as high as a voltage charged with the bootstrap capacitor CH, if the voltage VCTR is high, the voltage HV is also high. Accordingly, in order for the voltage HV to be lower than the power source voltage Vcc, the voltage VCTR has to be lower than a voltage (Vcc−VCH) that is obtained by subtracting the voltage VCH of the capacitor CH from the power source voltage Vcc. Then, the voltage HV is lower than the power source voltage Vcc so that the diode DB conducts.

The voltage VCTR is the same as a drain-source voltage VDS of the low-side switch M2. The zero voltage switching of the low-side switch M2 is normally performed when the voltage VCTR is 0. Accordingly, if the low-side switch M2 is turned on when the voltage VCTR is not 0, the switching of the low-side switch M2 fails in terms of the zero voltage switching. This is called non-zero voltage switching.

According to the embodiment of the present invention, if the low-side switch M2 is turned on when the voltage VCTR is higher than the voltage (Vcc−VCH), it is determined to be non-zero voltage switching.

In other words, if low-side switch M2 is turned on when the diode DB is conductive, it is determined to be non-zero voltage switching. When the diode DB is conductive, the charge current ID is flowing. Therefore, it is determined to be the non-zero voltage switching if the low-side switch M2 is turned on when the charge current ID is flowing. In this way, the non-zero voltage switching of the low-side switch M2 can be determined.

According to the embodiment of the present invention, the abnormal switching monitoring device 400 includes a comparator 410, an AND gate 420, and the bootstrap circuit 430 supplying a power source to the high-side gate driver 210.

The bootstrap circuit 430 includes the resistor RD, the diode DB, and the bootstrap capacitor CH. The resistor RD, the diode DB, and the bootstrap capacitor CH are connected in series, the power source voltage Vcc is transmitted to the resistor RD, and the bootstrap capacitor CH is connected with the high-side switch M1 and the low-side switch M2. An inversion terminal (−) of the comparator 410 is connected to a first end of the resistor RD, and receives the power source voltage Vcc. An non-inversion terminal (+) of the comparator 410 is connected to a second end of the resistor RD. The second end of the resistor RD is connected to an anode of the diode DB, and a cathode of the diode DB is connected to the first end of the bootstrap capacitor CH. Accordingly, the charging current ID flows in only the direction charging the bootstrap capacitor CH.

When the charge current ID flows to the bootstrap capacitor CH, a voltage drop between both ends of the resistor RD is generated. When the charge current ID does not flow to the bootstrap capacitor CH, the voltage drop between both ends of the resistor RD is not generated. Then, a voltage of the second end of the resistor RD is the same as the power source voltage Vcc.

The comparator 410 outputs a low level signal when a voltage inputted to the non-inversion terminal (+) is lower than a voltage inputted to the inversion terminal (−). The comparator 410 outputs a high level signal when a voltage inputted to the non-inversion terminal (+) is the same as or higher than a voltage inputted to the inversion terminal (−). An output signal of the comparator 410 will now be called a charge pulse CP. When the charge current ID flows to the bootstrap capacitor CH, the charge pulse CP is low level. When the charge current ID does not flow to the bootstrap capacitor CH, the charge pulse CP is a high level.

The AND gate 420 generates a non-zero switching detection signal NZS that informs the of non-zero voltage switching in a period when the gate signal VG2 and the charge pulse CP are high levels. That is, the abnormal switching monitoring device 400 determines that it is the non-zero voltage switching when the low-side switch M2 is turned on during a period when the charge current ID does not flow.

Figure 2:
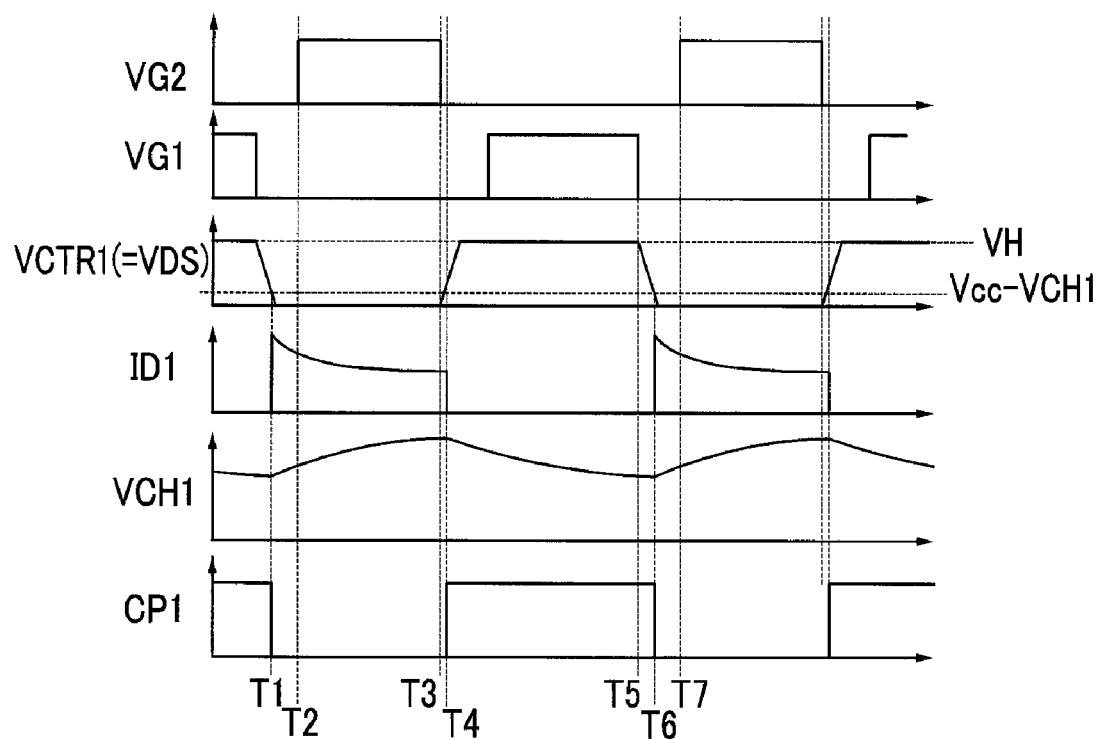
FIG. 2 shows signals that are generated in the converter and a switch controller in case of zero voltage switching.

FIG. 2 shows signals generated in the converter and the switch controller in case of the zero voltage switching.

Figure 3:
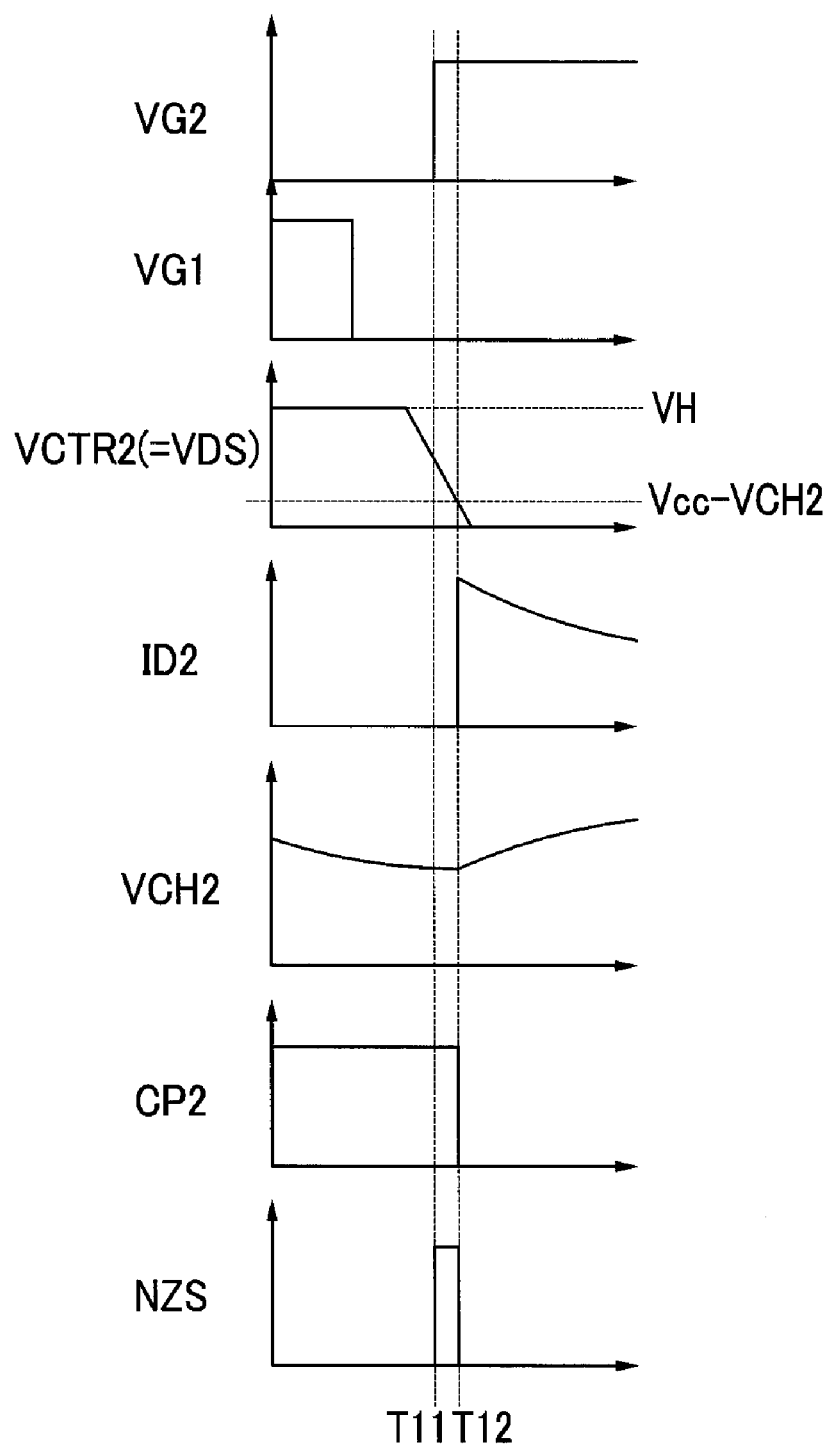
FIG. 3 shows signals that are generated in the converter and the switch controller in case of non-zero voltage switching.

FIG. 3 shows signals generated in the converter and the switch controller in case of the non-zero voltage switching. Each of voltages VCTR1 and VCTR2 are the same as a drain-source voltage VDS at the low-side switch M2.

In FIG. 2, the VCTR1, an ID1, a VCH1, and a CP1 are generated in case the zero voltage switching is normally performed, and the VCTR2, an ID2, a VCH2, and a CP2 are generated in case the zero voltage switching has failed.

Firstly, the case of the zero voltage switching will be described.

At a time point T1, when the voltage VCTR1 reaches a voltage (Vcc−VCH1) that is obtained by subtracting the voltage VCH1 of the bootstrap capacitor CH from the power source voltage Vcc, the voltage HV also reaches the power source voltage Vcc and the diode DB conducts, and the charge current ID flows through the diode DB. The bootstrap capacitor CH begins to be charged by the charge current ID1, and the voltage VCH1 of the bootstrap capacitor CH begins to increase. When the charge current ID1 begins to flow, the voltage at the inversion terminal (−) of the comparator 410 is higher than that of the non-inversion terminal (+) so that the charge pulse CP1 becomes a low level.

At a time point T2, when the low-side gate signal VG2 becomes a high level, the low-side switch M2 is turned on.

And at a time point T3, when the low-side gate signal VG2 becomes a low level, the low-side switch M2 is turned off. From the time point T3, the voltage VCTR1 begins to increase, and at a time point T4, the voltage VCTR1 reaches the voltage Vcc−VCH1.

From the time point T1 to the time point T4, the bootstrap capacitor CH is charged by the charge current ID1 and the voltage VCH1 increases. The voltage VCH1 increases and the voltage HV increases so that the charge current ID1 slowly decreases according to a decrease of a difference between the power source voltage Vcc and the voltage HV.

After the low-side switch M2 is turned off, the voltage VCTR1 begins to increase from the time point T3, reaches the voltage (Vcc−VCH1) at the time point T4, and is larger than the voltage (Vcc−VCH1) after the time point T4.

After the time point T4, the diode DB is turned off and the charge current ID1 does not flow. The voltage VCTR1 increases up to a predetermined voltage VH after the time point T3, and is maintained with the voltage VH until the high-side switch M1 is turned off.

At the time point T4, since the charge current ID1 does not flow, the voltage inputted to the non-inversion terminal of the comparator 410 is the same as the voltage inputted to the inversion terminal, and the charge pulse CP1 becomes a high level.

At a time point T5, when the high-side switch M1 is turned off, the voltage VCTR1 begins to decrease, and at a time point T6, it reaches the voltage Vcc−VCH1.

At the time point T6, since the charge current ID1 starts to flow, the voltage inputted to the inversion terminal (−) of the comparator 410 is higher than the voltage inputted to the non-inversion terminal (+) and the charge pulse CP1 becomes a low level.

At a time point T7, when the low-side gate signal VG2 becomes a high level, the low-side switch M2 is turned on.

In this way, in case the zero voltage switching is normally performed, a time point when the low-side switch M2 is turned on is later than a time point when the voltage VCTR1 reaches the voltage (Vcc−VCH1), and the charge current ID1 is generated.

Accordingly, since there is no period when the low-side gate signal VG2 and the charge pulse CP1 inputted to the AND gate 420 are simultaneously high level, the AND gate 420 generates the non-zero switching detection signal NZS being a low level in case the zero voltage switching is normally performed. The non-zero switching detection signal NZS is in the low level, which means that the zero voltage switching is normally performed.

Next, referring to FIG. 3, a case that the zero voltage switching has failed, i.e., the non-zero voltage switching, will be described.

At a time point T11, when the low-side gate signal VG2 becomes a high level, the low-side switch M2 is turned on.

At a time point T12, the voltage VCTR2 reaches the voltage (Vcc−VCH2) that is obtained by subtracting the voltage VCH2 of the capacitor CH from the power source voltage Vcc. Then the voltage VCTR2 becomes smaller than the voltage Vcc−VCH2.

At the time point T12, the voltage HV reaches the power source voltage Vcc and then is smaller than the power source voltage Vcc. Then, the diode DB is conductive, and from the time point T12, the charge current IDS begins to flow through the diode DB. The bootstrap capacitor CH is charged by the charge current ID2, and the voltage VCH2 of the bootstrap capacitor CH increases after the time point T12.

The charge current ID2 flows, and the voltage inputted to the inversion terminal (−) of the comparator 410 is higher than the voltage inputted to the non-inversion terminal (+) so that the charge pulse CP2 becomes a low level at the time point T12.

During the time point T11 to T12, since the charge pulse CP2 and the low-side gate signal VG2 are high levels, the AND gate 420 generates the non-zero switching detection signal NZS being in the high level. That is, the non-zero voltage switching occurs.

As described above, comparing the low-side gate signal VG2 with rising edge timing of the charge current ID2 charging the bootstrap capacitor CH, it can be determined whether the non-zero voltage switching occurs.

The abnormal switching monitoring device and the method of the low-side switch have been described thus far.

Figure 4:
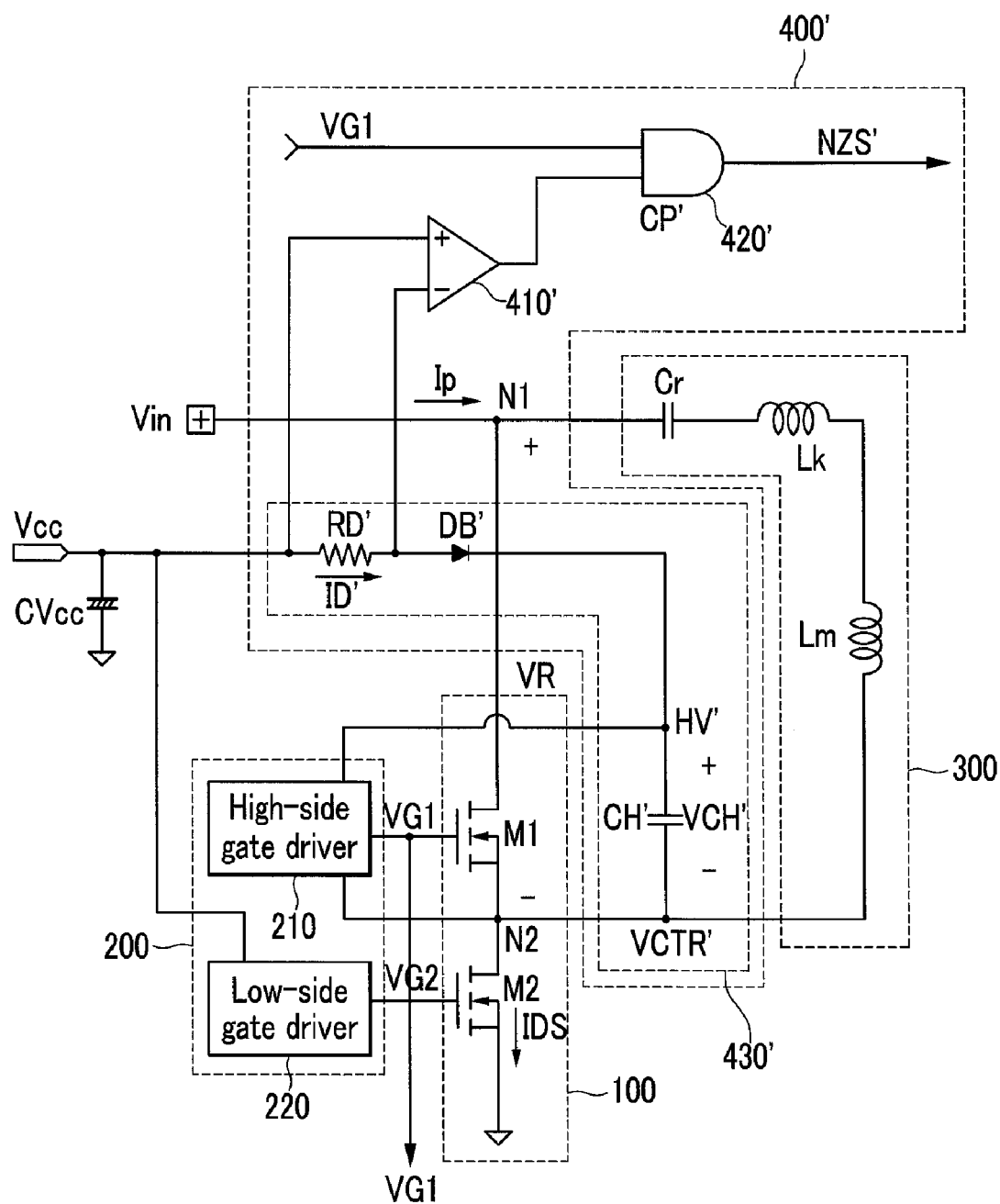
FIG. 4 shows a high-side switch abnormal switching monitoring device according to another exemplary embodiment of the present invention.
Figure 5:
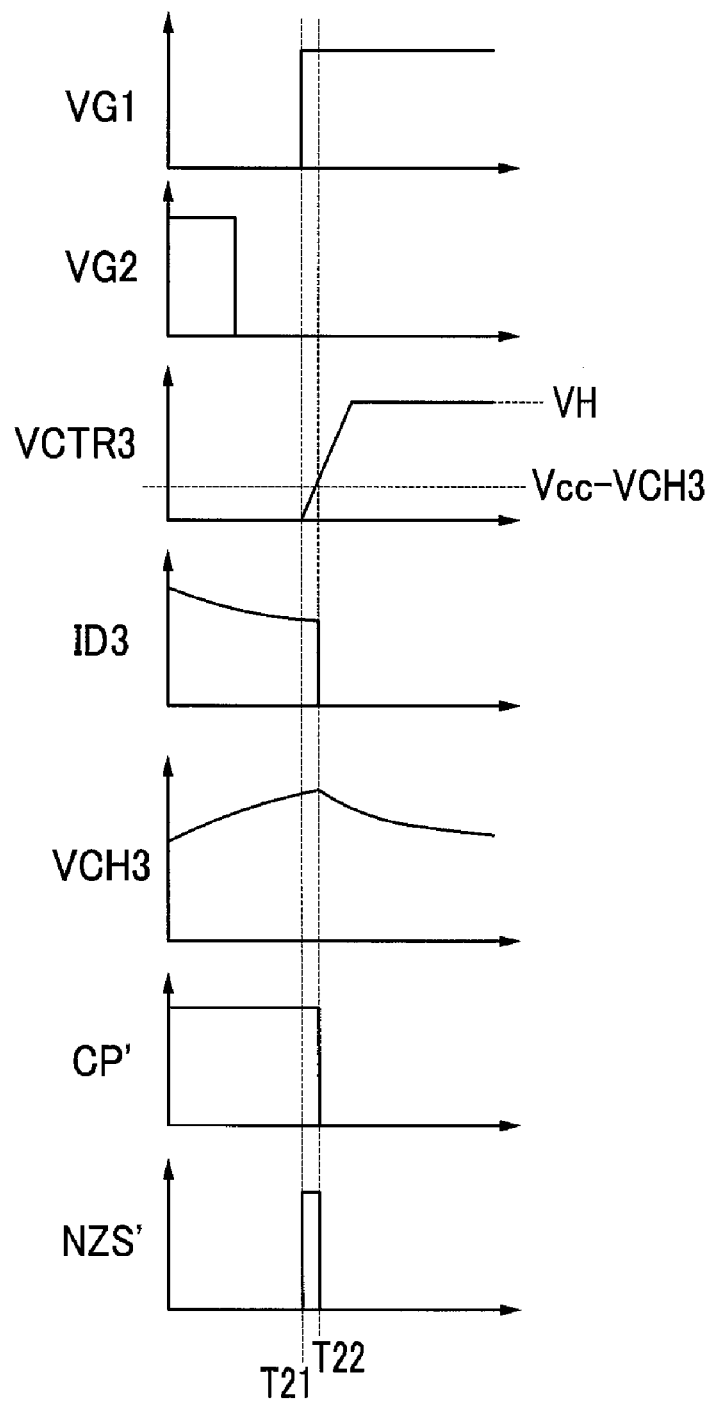
FIG. 5 shows signals that are generated in the converter and the switch controller in case of non-zero voltage switching according to another exemplary embodiment of the present invention.

Referring to FIGS. 4 and 5, an abnormal switching monitoring device and method of the high-side switch will be described.

FIG. 4 shows an abnormal switching monitoring device 400' of a high-side switch M1 according to another exemplary embodiment of the present invention. The same reference numerals are used for the same configurations as in the above-described embodiment.

In case a time point when a charge current ID' charging a bootstrap capacitor CH' does not flow is later than a time point when the high-side switch M1 is turned on, the switching of the high-side switch M1 has failed in terms of the zero voltage switching.

That is, in case a time point when the voltage VCTR' reaches the voltage (Vcc−VCH') that is obtained by subtracting the voltage VCH' of the capacitor CH' from the power source voltage Vcc is later than a time point when the high-side switch M1 is turned on, the high-side switch M1 does the non-zero voltage switching.

A voltage between both ends of the high-side switch M1 is a voltage that is a difference between the input voltage Vin and the voltage VCTR'. When the voltage VCTR' is smaller than the voltage (Vcc−VCH'), the voltage of the both ends of the high-side switch M1 is higher than a 0 voltage. The abnormal switching monitoring device 400' has the same configuration as the abnormal switching monitoring device 400 as described above, except for signals inputted to an inversion terminal (−) and a non-inversion terminal (+) of a comparator 410' and a signal inputted to an AND gate 420'.

When a voltage at the non-inversion terminal (+) of the comparator 410' is the same with a voltage at the inversion terminal (−) or lower than the voltage at the inversion terminal (−), the comparator 410' generates a low level charge pulse CP'. An overlapped exemplary embodiment with that described above will be omitted. The inversion terminal (−) of the comparator 410' is connected with an anode of a diode DB' and a first end of a resistor RD', and the non-inversion terminal (+) is connected to a second end to the resistor RD'. Accordingly, when the charge current ID' flows through the resistor RD', a voltage drop the voltage at the inversion terminal (−) is smaller than that at the non-inversion terminal (+) so as to output a high level charge pulse CP'.

On the other hand, when the charge current ID' does not flow through the resistor RD', since the voltage drop is not made at the resistor RD', the voltage at the non-inversion terminal (+) of the comparator 410' is the same as that of the inversion terminal (−) of the comparator 410'. Then, the comparator 410' outputs a low level signal.

The AND gate 420' generates a non-zero switching detection signal NZS' for informing of non-zero voltage switching in a period when the high-side gate signal VG1 and the charge pulse CP' are in the high level. That is, the abnormal switch monitoring device 400' determines the non-zero voltage switching when the high-side switch M1 is turned on during a period when the charge current ID' flows.

FIG. 5 shows signals that are generated in the converter and the switch controller in case of non-zero voltage switching according to another exemplary embodiment of the present invention. When the abnormal switching monitoring device 400' senses non-zero voltage switching, the abnormal switching monitoring device 400' generates a non-zero switching detection signal NZS' having a high level pulse according to another exemplary embodiment of the present invention. In order to distinguish this exemplary embodiment of the present invention from the above exemplary embodiment, the voltage VCH' charged to the bootstrap capacitor CH' is shown as VCH3, the voltage VCTR' of the second end of the bootstrap capacitor CH' is shown as VCTR3, and the charge current ID' is shown as ID3 in FIG. 5.

As shown in FIG. 5, at a time point T21, when the high-side gate signal VG1 becomes a high level, the high-side switch M1 is turned on.

At a time point T22, the voltage VCTR3 reaches the voltage (Vcc−VCH3) that is obtained by subtracting the voltage VCH3 of the capacitor CH' from the power source voltage Vcc. And then the voltage VCTR3 is larger than the voltage (Vcc−VCH3) and the voltage HV' is larger than the power source voltage Vcc.

Then, after the time point T22, the diode DB' is blocked and the charge current ID3 flows to the diode DB' at the time point T22. Accordingly, the charge pulse CP' is maintained at a high level at the time point T22. During the time points T21 to T22, since the charge pulse CP' and the high-side gate signal VG1 are in the high level, the AND gate 420' generates the high level non-zero switching detection signal NZS'. That is, the non-zero voltage switching occurs.

As described above, by using the high-side gate signal VG1 and the charge current ID', whether the zero voltage switching is performed or has failed is known. Thus far, by using the resistors RD and RD', it is sensed that a current flows to the bootstrap capacitor, but the present invention is not limited thereto and other elements can be used for sensing the current.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An abnormal switching monitoring device monitoring abnormal non-zero voltage switching of a low-side switch connected to a second electrode of a high-side switch including a first electrode receiving an input voltage, the abnormal switching monitoring device comprising
a bootstrap circuit supplying an operating current to a gate driver controlling a switching operation of the high-side switch, wherein
the abnormal switching monitoring device compares a time point when a current begins to flow through the bootstrap circuit with a time point when the low-side switch is turned on so as to determine whether or not non-zero voltage switching of the low side switch occurs.

2. The abnormal switching monitoring device of claim 1, wherein
the bootstrap circuit comprises:
a bootstrap capacitor connected to the gate driver and supplying the operating current thereto;
a diode that makes the current flow to the bootstrap capacitor; and
a current monitoring element comprising a first end to which the power source voltage is applied and a second end connected to the diode.

3. The abnormal switching monitoring device of claim 2, wherein
the current monitoring element is a resistor.

4. The abnormal switching monitoring device of claim 2, wherein
a first end of the bootstrap capacitor is connected to a cathode of the diode, a second end of the bootstrap capacitor is connected to a second electrode of the high-side switch, and an anode of the diode is connected to the second end of the current monitoring element.

5. The abnormal switching monitoring device of claim 2, wherein
voltages of both ends of the current monitoring element are compared with each other, and the comparison result and a low-side gate signal controlling the low-side switch are used so as to determine whether or not the non-zero voltage switching occurs.

6. The abnormal switching monitoring device of claim 5, further comprising:
a comparator including an inversion terminal connected to the first end of the current monitoring element and an non-inversion terminal connected to the second end of the current monitoring element; and
an AND gate receiving an output signal of the comparator and a low-side gate signal.

7. The abnormal switching monitoring device of claim 1, wherein a time point when the bootstrap capacitor charge current begins to flow is later than a time point when the low-side switch is turned on, which is determined as non-zero voltage switching.

8. An abnormal switching monitoring device monitoring abnormal non-zero voltage switching of the high-side switch including a first electrode receiving an input voltage, the abnormal switching monitoring device comprising
a bootstrap circuit supplying an operating current to a gate driver controlling a switching operation of the high-side switch, wherein
a time point when the current does not flow through the bootstrap circuit is compared with a time point when the high-side switch is turned on so as to determine whether or not non-zero voltage switching of the high-side switch occurs.

9. The abnormal switching monitoring device of claim 8, wherein
the bootstrap circuit comprises:
a bootstrap capacitor connected to the gate driver and supplying an operating current;
a diode that makes the current flow to the bootstrap capacitor; and
a current monitoring element comprising a first end to which the power source voltage is applied and a second end connected to the diode.

10. The abnormal switching monitoring device of claim 9, wherein
the current monitoring element is a resistor.

11. The abnormal switching monitoring device of claim 9, wherein
   a first end of the bootstrap capacitor is connected to a cathode of the diode, a second end of the bootstrap capacitor is connected to a second electrode of the high-side switch, and an anode of the diode is connected to the second end of the current monitoring element.

12. The abnormal switching monitoring device of claim 9, wherein
   voltages of both ends of the current monitoring element are compared with each other, and the comparison result and a high-side gate signal controlling the high-side switch are used so as to determine whether or not the non-zero voltage switching occurs.

13. The abnormal switching monitoring device of claim 12, further comprising:
   a comparator including an non-inversion terminal connected to the first end of the current monitoring element and an inversion terminal connected to the second end of the current monitoring element; and
   an AND gate receiving an output signal of the comparator and a high-side gate signal.

14. The abnormal switching monitoring device of claim 8, wherein a time point when the bootstrap capacitor charge current stops flowing is later than a time point when the high-side switch is turned on, which is determined to be non-zero voltage switching.

15. An abnormal switching monitoring method monitoring non-zero voltage switching of a low-side switch connected to a second electrode of a high-side switch including a first electrode receiving an input voltage, the method comprising:
   monitoring a charge current charging a bootstrap capacitor that supplies an operating current to a gate driver controlling a switching operation of the high-side switch;
   comparing a time point when the low-side switch is turned on with a time point when the charge current begins to flow; and
   determining whether or not non-zero voltage switching of the low-side switch occurs according to the comparison result.

16. The method of claim 15, further comprising determining the non-zero voltage switching when a time point when the charge current begins to flow is later than a time point when the low-side switch is turned on.

17. An abnormal switching monitoring method monitoring non-zero voltage switching of a high-side switch including a first electrode receiving an input voltage, the method comprising:
   monitoring a charge current charging a bootstrap capacitor that supplies an operating current to a gate driver controlling a switching operation of the high-side switch;
   comparing a time point when the high-side switch is turned on with a time point when the charge current stops flowing; and
   determining whether or not non-zero voltage switching of the high-side switch occurs according to the comparison result.

18. The method of claim 17, further comprising determining the non-zero voltage switching when a time point when the charge current stops flowing is later than a time point when the high-side switch is turned on.

* * * * *